(12) United States Patent
Kim et al.

(10) Patent No.: US 12,421,052 B2
(45) Date of Patent: Sep. 23, 2025

(54) OVERHEAD HOIST TRANSPORT DEVICE

(71) Applicant: SEMES CO., LTD., Chungcheongnam-do (KR)

(72) Inventors: Hanbit Kim, Chungcheongnam-do (KR); Daeil Jang, Chungcheongnam-do (KR); Jongseon Jeon, Chungcheongnam-do (KR); Jungdae Kim, Chungcheongnam-do (KR); Hyojoo Jeoun, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 175 days.

(21) Appl. No.: 18/376,427

(22) Filed: Oct. 3, 2023

(65) Prior Publication Data

US 2024/0174451 A1 May 30, 2024

(30) Foreign Application Priority Data

Nov. 25, 2022 (KR) .................. 10-2022-0160795

(51) Int. Cl.
*B65G 43/04* (2006.01)
*B65G 17/20* (2006.01)
(Continued)

(52) U.S. Cl.
CPC ............. *B65G 43/04* (2013.01); *B65G 17/48* (2013.01); *B65G 35/06* (2013.01); *B65G 17/20* (2013.01);
(Continued)

(58) Field of Classification Search
CPC ...... B65G 35/06; B65G 17/485; B65G 17/20; B65G 43/04; B65G 2201/0297;
(Continued)

(56) References Cited

U.S. PATENT DOCUMENTS 9,715,810 B2 7/2017 Min et al.
11,474,536 B2 10/2022 Kim et al.
(Continued)

FOREIGN PATENT DOCUMENTS

DE 102020104603 A1 * 8/2021 ............. B65G 43/04
KR 10-2011-0013852 2/2011
(Continued)

OTHER PUBLICATIONS

Office Action dated Apr. 3, 2024 for Korean Patent Application No. 10-2022-0160795 and its English translation from Global Dossier.

*Primary Examiner* — James R Bidwell
(74) *Attorney, Agent, or Firm* — WOMBLE BOND DICKINSON (US) LLP

(57) ABSTRACT

Provided is an overhead hoist transport device including an article transport vehicle having a space in which articles are loaded and unloaded, and including traveling wheels, guide wheels, and steering wheels, a traveling rail positioned along a ceiling of a semiconductor manufacturing line and providing a moving path for the article transport vehicle, a measuring sensor attached to the article transport vehicle and configured to measure a traveling state of the article transport vehicle, and a system configured to receive measured values from the measuring sensor, wherein the traveling rail includes at least one traveling section among a straight section, a curved section, and a branching section, and wherein the system is further configured to determine whether specific wheels of the article transport vehicle are detached on the traveling rail.

20 Claims, 14 Drawing Sheets

(51) Int. Cl.
  *B65G 17/48* (2006.01)
  *B65G 35/06* (2006.01)
  *B66C 13/18* (2006.01)
  *B66C 17/00* (2006.01)

(52) U.S. Cl.
  CPC ............... *B65G 2201/0297* (2013.01); *B65G 2203/0291* (2013.01); *B65G 2203/042* (2013.01); *B66C 13/18* (2013.01); *B66C 17/00* (2013.01)

(58) Field of Classification Search
  CPC ...... B65G 2203/0291; B65G 2203/042; B66C 13/18; B66C 17/00
  USPC ....................................................... 198/678.1
  See application file for complete search history.

(56) References Cited

U.S. PATENT DOCUMENTS

| | | | | |
|---|---|---|---|---|
| 2015/0368074 | A1* | 12/2015 | Sturm | B66C 17/00 |
| | | | | 212/312 |
| 2017/0313520 | A1* | 11/2017 | Tsai | B65G 17/485 |
| 2020/0087074 | A1* | 3/2020 | Tsai | G01N 1/24 |
| 2021/0362949 | A1* | 11/2021 | Morimoto | B61B 3/02 |
| 2022/0126699 | A1* | 4/2022 | Lee | H01L 21/67733 |
| 2023/0322496 | A1* | 10/2023 | Yoon | B65G 49/061 |

FOREIGN PATENT DOCUMENTS

| | | |
|---|---|---|
| KR | 10-2017-0009299 | 1/2017 |
| KR | 10-2020-0053744 | 5/2020 |
| KR | 10-2021-0041348 | 4/2021 |
| KR | 10-2021-0055292 | 5/2021 |
| KR | 10-2362159 | 2/2022 |
| KR | 10-2385265 | 4/2022 |
| KR | 10-2022-0097701 | 7/2022 |

\* cited by examiner

OVERHEAD HOIST TRANSPORT DEVICE

CROSS-REFERENCE TO RELATED APPLICATION

This application is based on and claims priority under 35 U.S.C. § 119 to Korean Patent Application No. 10-2022-0160795, filed on Nov. 25, 2022, in the Korean Intellectual Property Office, the disclosure of which is incorporated by reference herein in its entirety.

BACKGROUND

1 Field

The disclosure relates to an overhead hoist transport device, and more particularly, to an overhead hoist transport device capable of determining whether the wheels thereof are detached.

2 Description of the Related Art

The production process for semiconductor products requires hundreds of operations to produce finished products and hundreds of thousands of logistics movements during these operations. In order to protect semiconductor materials from contamination, damage, and delivery accidents during the logistics process, semiconductor manufacturing lines use overhead hoist transport device as a logistics automation system. The overhead hoist transport devices, as a system that automates logistics transportation between numerous semiconductor processes, transport wafers in a front opening unified pod (FOUP) to manufacturing equipment for each production process along rails installed on the ceiling.

SUMMARY

Provided is an overhead hoist transport device capable of determining a traveling section of an article transport vehicle and determining whether wheels of the article transport vehicle are detached.

Provided is an overhead hoist transport device capable of determining whether specific wheels of an article transport vehicle are detached for each traveling section.

Additional aspects will be set forth in part in the description which follows and, in part, will be apparent from the description, or may be learned by practice of the presented embodiments of the disclosure.

According to an aspect of the disclosure, an overhead hoist transport device includes: an article transport vehicle having a space in which articles are loaded and unloaded and including traveling wheels, guide wheels, and steering wheels, a traveling rail positioned along a ceiling of a semiconductor manufacturing line and providing a moving path for the article transport vehicle, a measuring sensor attached to the article transport vehicle and configured to measure a traveling state of the article transport vehicle, and a system configured to receive measured values from the measuring sensor, wherein the traveling rail includes at least one traveling section among a straight section, a curved section, and a branching section, and wherein the system is configured to determine whether specific wheels of the article transport vehicle are detached on the traveling rail.

In an embodiment of the disclosure, the measuring sensor may measure the speed, vibration, and torque of the article transport vehicle.

In an embodiment of the disclosure, an axis perpendicular to the ceiling may be a Z-axis, and the curved section may be a section in which the article transport vehicle rotates clockwise or counterclockwise with respect to the Z-axis and the branching section may be a section in which the article transport vehicle rotates clockwise and counterclockwise at intervals with respect to the Z-axis.

In an embodiment of the disclosure, the system may be configured to determine in which section of the traveling rail the article transport vehicle is traveling.

In an embodiment of the disclosure, an axis perpendicular to the ceiling may be a Z-axis, and the measuring sensor may be configured to measure a direction in which the article transport vehicle rotates with respect to the Z-axis and the system may be configured to determine in which section of the traveling rail the article transport vehicle is traveling with respect to the direction.

In an embodiment of the disclosure, which of the traveling wheels, the guide wheels, and the steering wheels of the article transport vehicle rotate may be different for each of the straight section, the curved section, and the branching section.

In an embodiment of the disclosure, the system may determine whether traveling wheels are detached when the article transport vehicle is traveling in the straight section, may determine whether the guide wheels are detached when the article transport vehicle is traveling in the curved section, and may determine whether the steering wheels are detached when the article transport vehicle is traveling in the branching section.

In an embodiment of the disclosure, the system may be configured to store traveling standard value of the traveling section, and compare the traveling standard value with measured values of the measuring sensor to determine whether wheels of the article transport vehicle are detached.

According to another aspect of the disclosure, an overhead hoist transport device includes article transport vehicles having space in which articles are loaded and unloaded, including traveling wheels, guide wheels, and steering wheels, a traveling rail, positioned along the ceiling of a semiconductor manufacturing line, providing a moving path of the article transport vehicles, measuring sensors, attached to the different article transport vehicles, for measuring the traveling state of the article transport vehicles in real time, a server transmitting and receiving measured values of the measuring sensors, and a system configured to receive measured values from the server, wherein the traveling rail includes at least one traveling section among a straight section, a curved section, and a branching section, and wherein the system is configured to determine whether specific wheels of the article transport vehicles are detached on the traveling rail.

In an embodiment of the disclosure, the server and the system may be located apart from the article transport vehicles, and the measuring sensors may transmit and receive measured values wirelessly to and from the server.

In an embodiment of the disclosure, the system may be configured to monitor the traveling state of the article transport vehicles in real time.

In an embodiment of the disclosure, the system may be configured to generate travel reference values of the traveling section, and generate residual data by calculating the travel reference values and the measured values.

In an embodiment of the disclosure, the system may be configured to determine, by visualizing the residual data, whether specific wheels of the article transport vehicles are detached.

In an embodiment of the disclosure, the system may include a variational autoencoder, and may be configured to determine whether specific wheels of the article transport vehicles are detached through the variational autoencoder.

In an embodiment of the disclosure, the traveling wheels may be connected to and driven by a drive, and the guide wheels and the steering wheels may be configured to rotate in contact with the traveling rail.

According to the other aspect of the disclosure, an overhead hoist transport device includes article transport vehicles having space in which articles are loaded and unloaded, including traveling wheels, guide wheels, and steering wheels, a traveling rail, including a straight section, a curved section, and a branching section along the ceiling of a semiconductor manufacturing line, providing a moving path of the article transport vehicles, measuring sensors, attached to the different article transport vehicles, for measuring the speed, vibration and torque of the article transport vehicles in real time, a server transmitting and receiving measured values of the measuring sensors and a system configured to receive measured values from the server and monitor the traveling state of the article transport vehicles in real time, wherein the server and the system are located apart from the article transport vehicles, and wherein the system is configured to determine whether specific wheels of the article transport vehicles are detached for each section of the traveling rail.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
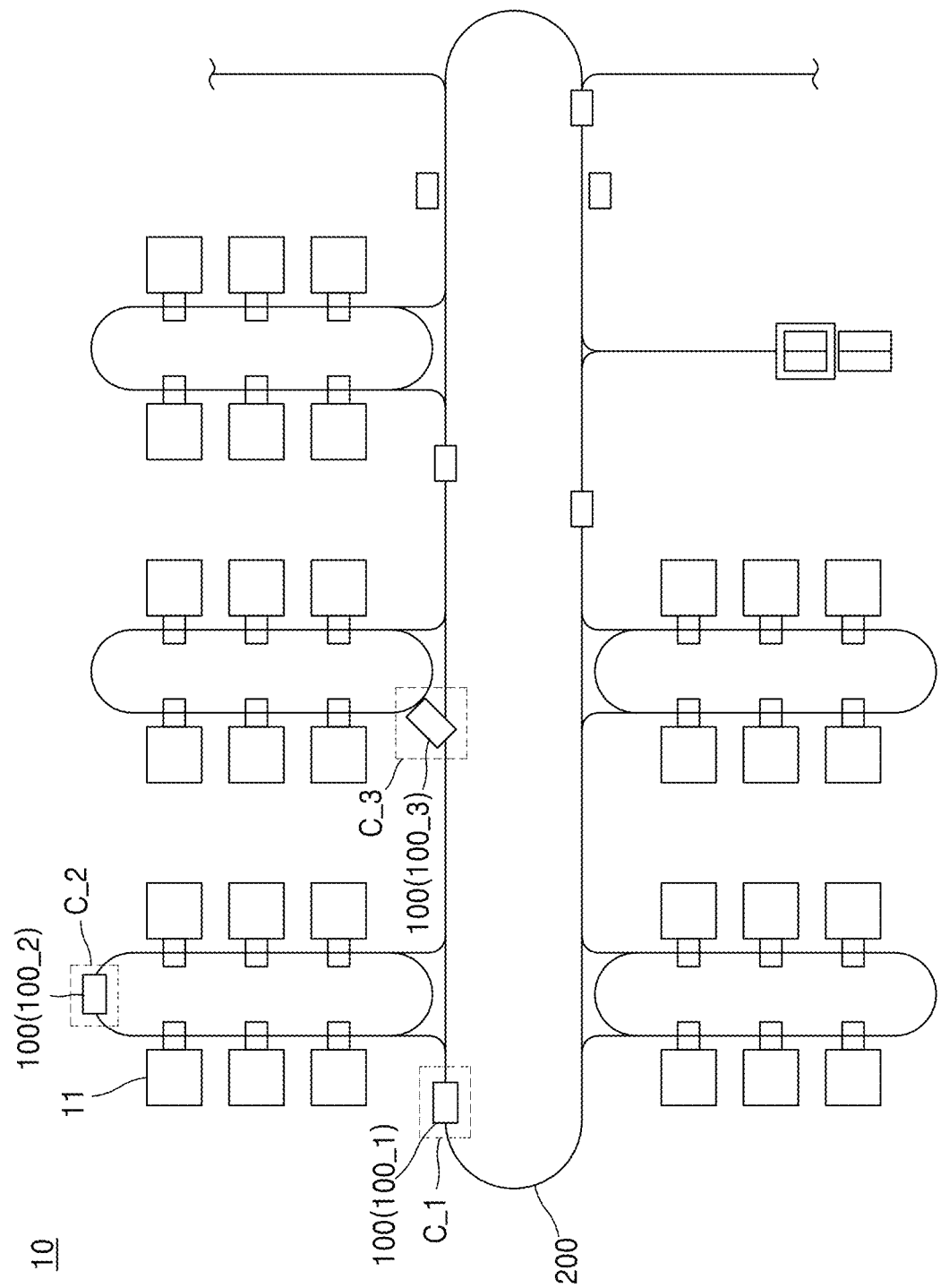
FIG. 1 is a schematic conceptual diagram of an overhead hoist transport device according to an embodiment of the disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Figure 2:
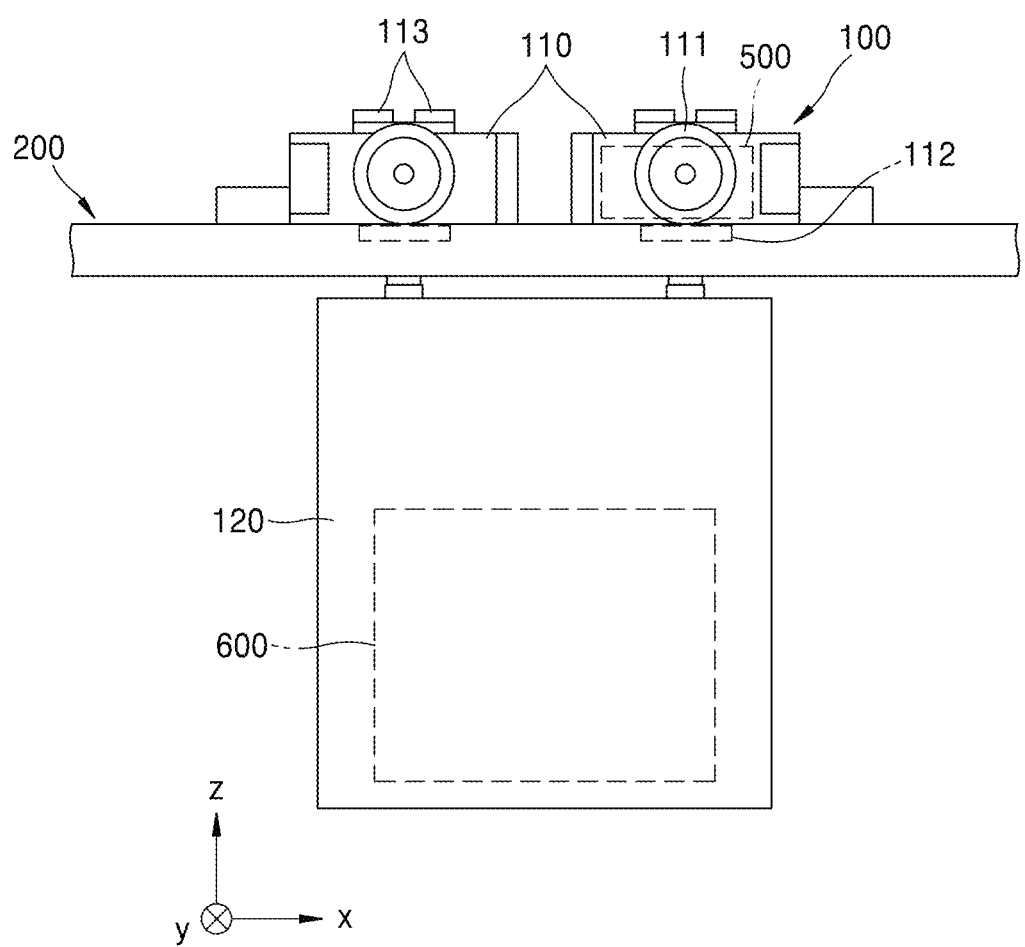
FIGS. 2 and 3 are detailed configuration diagrams of the overhead hoist transport device of FIG. 1.
Figure 3:
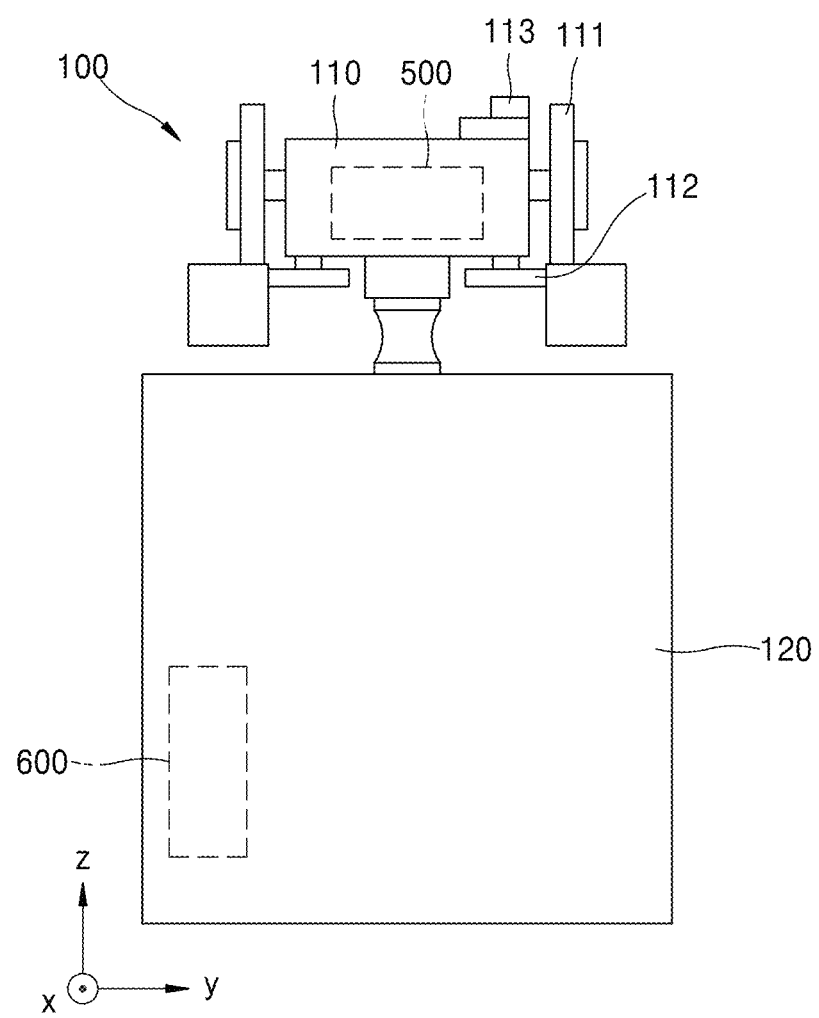

FIG. 1 is a schematic conceptual diagram of an overhead hoist transport device according to an embodiment of the disclosure. FIGS. 2 and 3 are detailed configuration diagrams of an overhead hoist transport device of FIG. 1.

Referring to FIGS. 1 to 3, the overhead hoist transport device 10 may include an article transport vehicle 100, a traveling rail 200, a measuring sensor 500, and a system 600.

Hereinafter, a direction in which the traveling rail 200 extends is defined as an X direction, a direction perpendicular to the X direction is defined as a Y direction, and a direction perpendicular to each of the X and Y directions is defined as a Z direction. In other words, a Z-axis may be perpendicular to the ceiling.

The article transport vehicle 100 of the overhead hoist transport device 10 may have space in which articles are loaded and unloaded. The article transport vehicle 100 may be configured to transport articles. The articles include semiconductor devices, display devices, printed circuit boards, glass substrates, and wafers used in the manufacturing process of semiconductor devices or display devices.

The article transport vehicle 100 may include a traveling module 110 and an elevating module 120. The traveling module 110 may enable the article transport vehicle 100 to move on the traveling rail 200. The elevating module 120 may be configured to be connected to the bottom of the traveling module 110 in a suspended manner through a rotating shaft. According to embodiments, the elevating module 120 may be configured such that containers accommodating substrates are vertically movable.

The traveling module 110 may include traveling wheels 111, guide wheels 112, and steering wheels 113. The traveling wheels 111 may be connected to a motor to provide power so that the article transport vehicle 100 may travel. The guide wheels 112 may rotate in contact with the traveling rail 200 when the article transport vehicle 100 is traveling in the curved section C_2. When the article transport vehicle 100 selects a route in the branching section C_3, the steering wheels 113 may move in the Y-axis direction and rotate in contact with the traveling rail 200 of the set route. In other words, the traveling wheels 111 providing power to the article transport vehicle 100 may contact the traveling rail 200 in all sections C_1, C_2, and C_3. The guide wheels 112 may contact the traveling rail 200 in the curved section C_2. The guide wheels 113 may contact the traveling rail 200 in the branching section C_3.

In embodiments, which of the traveling wheels 111, the guide wheels 112, and the steering wheels 113 of the article transport vehicle 100 rotate may be different for each of the straight section C_1, the curved section C_2, and the branching section C_3. In other words, which of the traveling wheels 111, the guide wheels 112, and the steering wheels 113 of the article transport vehicle 100 contact the traveling rail 200 may be different for each of the straight section C_1, the curved section C_2, and the branching section C_3. In embodiments, the traveling wheels 111 may contact the traveling rail 200 when the article transport vehicle 100 is traveling in the straight section C_1. The traveling wheels 111 and the guide wheels 112 may contact the traveling rail 200 when the article transport vehicle 100 is traveling in the curved section C_2. The traveling wheels 111 and the steering wheels 113 may contact the traveling rail 200 when the article transport vehicle 100 is traveling in the branching section C_3.

The traveling rail 200 of the overhead hoist transport device 10 may be configured to provide a moving path for transporting articles to manufacturing equipment 11. The traveling rail 200 may provide a moving path to the article transport vehicle 100. The traveling rail 200 may be provided along the ceiling of a semiconductor manufacturing line, and the shape of the traveling rail 200 may vary depending on the arrangement of the manufacturing equipment 11.

The traveling rail 200 may include at least one traveling section among the straight section C_1, the curved section C_2, and the branching section C_3. The straight section C_1 may be a section in which the traveling rail 200 has no curvature. The curved section C_2 may be a section in which the traveling rail 200 has a curvature. The branching section C_3 may be a section in which the travel rail 200 is divided into a plurality of routes. In embodiments, the branching section may be in the form of a Y-branch or a T-branch.

In other words, the straight section C_1 may be a section in which the article transport vehicle 100 does not rotate with respect to the Z-axis. The curved section C_2 may be a section in which the article transport vehicle 100 rotates clockwise or counterclockwise with respect to the Z-axis. The branching section C_3 may be a section in which the article transport vehicle 100 rotates clockwise and counterclockwise with intervals with respect to the Z-axis. In other words, the rotation angle of the article transport vehicle 100 with respect to the Z-axis in the curved section C_2 may have one peak value, and the rotation angle of the article transport vehicle 100 with respect to the Z-axis in the branching section C_3 may have two peak values.

The measuring sensor 500 of the overhead hoist transport device 10 may be attached to the article transport vehicle 100. In embodiments, the measuring sensor 500 may be attached to the traveling module 110. FIGS. 2 and 3 show that the measuring sensor 500 is attached to the traveling module 110, but is not limited thereto, and the measuring sensor 500 may be attached to the elevating module 120.

The measuring sensor 500 may measure the traveling state of the article transport vehicle 100. Specifically, the measuring sensor 500 may measure the speed, vibration, and torque of the article transport vehicle 100. In other words, the measuring sensor 500 may measure the vibration of the article transport vehicle 100 in X-axis, Y-axis, Z-axis, yaw, pitch, and roll directions. The yaw is an angle of rotation with respect to the Z-axis. The measuring sensor 500 may measure the speed and torque of the article transport vehicle 100 in front wheel, rear wheel, hoist, and slide directions. In embodiments, the measuring sensor 500 may include a 6-axis gyro sensor.

In embodiments, the measuring sensor 500 may measure a direction in which the article transport vehicle 100 rotates with respect to the Z-axis. The measuring sensor 500 may obtain yaw of the article transport vehicle 100 by obtaining the angular velocity of yaw of the article transport vehicle 100. In embodiments, the angular velocity of yaw of the article transport vehicle 100 may have a positive peak value when the article transport vehicle 100 rotates clockwise, and the angular velocity of yaw of the article transport vehicle 100 may have a negative peak value when the article transport vehicle 100 rotates counterclockwise.

The system 600 of the overhead hoist transport device 10 may receive measured values from the measuring sensor 500. In embodiments, the system 600 located in the article transport vehicle 100 may be wired to the measuring sensor 500. FIGS. 2 and 3 show that the system 600 is located in the article transport vehicle 100, but is not limited thereto, and the system 600 may be located apart from the article transport vehicle 100.

The system 600 may be implemented in hardware, firmware, software, or any combination thereof. For example, the system 600 may be a computing device such as a workstation computer, a desktop computer, a laptop computer, or a tablet computer. The system 600 may also be a complex processor such as a microprocessor, CPU, GPU, etc., a processor configured by software, dedicated hardware or firmware. In embodiments, the system 600 may be implemented by general purpose computers or application-specific hardware such as digital signal process (DSP), field programmable gate array (FPGA), and application-specific integrated circuit (ASIC).

In embodiments, the operations of the system 600 may be implemented as commands stored on machine-readable media that can be read and executed by one or more processors, wherein the machine-readable media may contain arbitrary mechanisms for storing and/or transmitting information in readable form by machines (e.g., computing devices). For example, the machine-readable media may include read only memory (ROM), random access memory (RAM), magnetic disk storage media, optical storage media, flash memory devices, electrical, optical, acoustic or other forms of radio signals (e.g., carrier waves, infrared signals, digital signals, etc.) and any other signals.

The system 600 may determine whether wheels of the article transport vehicle 100 are detached in the traveling section of the traveling rail 200. In other words, the system 600 may determine whether specific wheels of the article transport vehicle 100 are detached in at least one traveling section among the straight section C_1, the curved section C_2, and the branching section C_3. In embodiments, the system 600 may determine whether the traveling wheels 111 are detached in the straight section C_1. The system 600 may determine whether the guide wheels are detached in the curved section C_2. The system 600 may determine whether the steering wheels are detached in the branching section C_3.

The system 600 may determine in which section the article transport vehicle 100 is traveling among the straight section C_1, the curved section C_2, and the branching section C_3, using the measured values of the measuring sensor 500. This will be described later with reference to FIGS. 4 to 7.

The system 600 may store traveling standard value of the straight section C_1, the curved section C_2, and the branching section C_3. In other words, the system 600 may store, in a database in advance, at least one of the traveling standard value of the straight section C_1, the traveling standard value of the curved section C_2, and the traveling standard value of the branching section C_3.

The system 600 may compare the traveling standard value and the measured values of the measuring sensor 500 to determine whether the wheels of the article transport vehicle 100 are detached. Specifically, the system 600 may compare the traveling standard value and the measured values that combine the values of vibration, speed, and torque of the article transport vehicle 100 measured by the measuring sensor 500. The system 600 may determine that wheels of the article transport vehicle 100 are in contact with the traveling rail 200 when the difference between the measured values and the traveling standard value is within an error range. The system 600 may determine that wheels of the article transport vehicle 100 are detached from the traveling rail 200 when the difference between the measured values and the traveling standard value is not within an error range. This will be described later with reference to FIG. 8.

The overhead hoist transport device 10 of the disclosure may determine whether wheels of the traveling transport vehicle 100 are detached through the system 600. That is, it is possible to determine whether wheels of the article transport vehicle 100 are detached without a regular inspection by a worker, and respond thereto. In addition, although there was an error in conventional determination of whether wheels are detached through visual inspection, the overhead hoist transport device 10 of the disclosure may determine whether wheels are detached through the system 600, which may allow accurate determination of whether wheels are detached.

Figure 4:
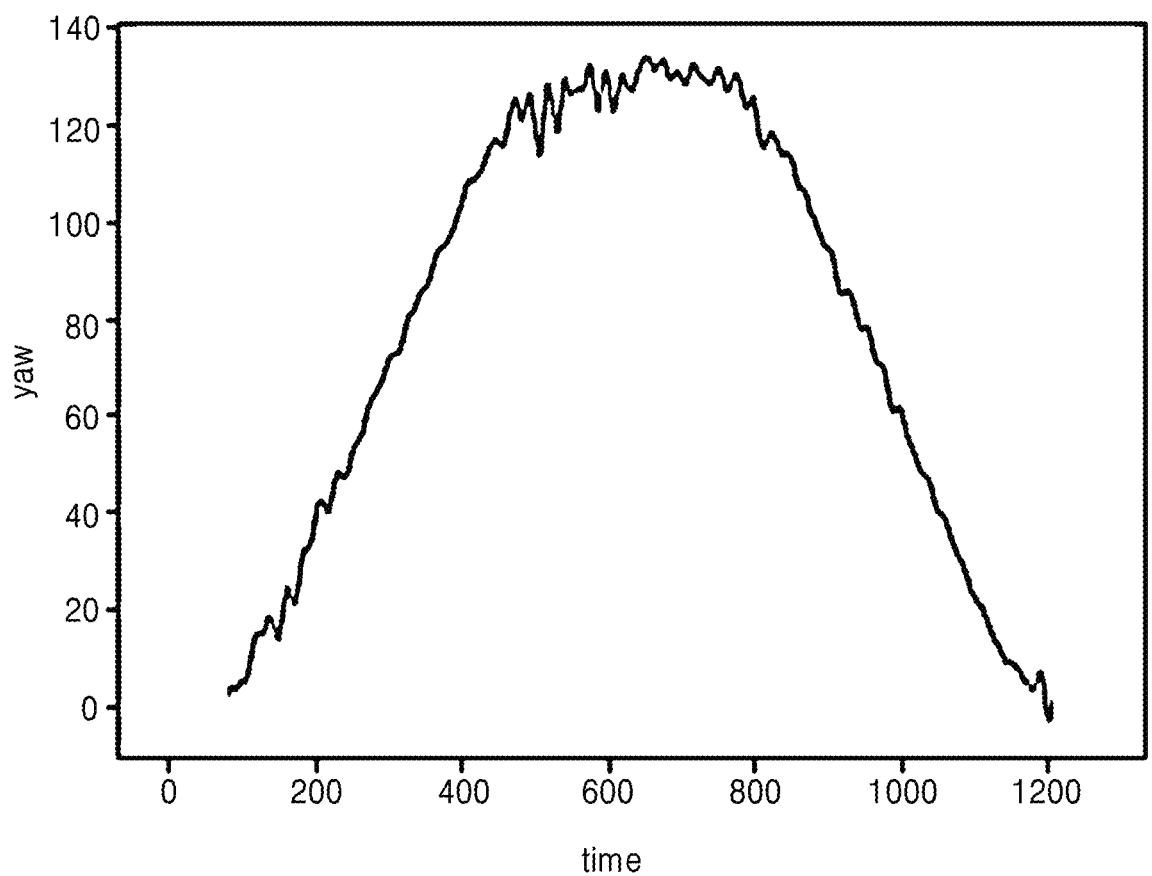
FIG. 4 is a graph of a change in angular velocity of yaw over time of an article transport vehicle of an overhead hoist transport device according to an embodiment of the disclosure.
Figure 5:
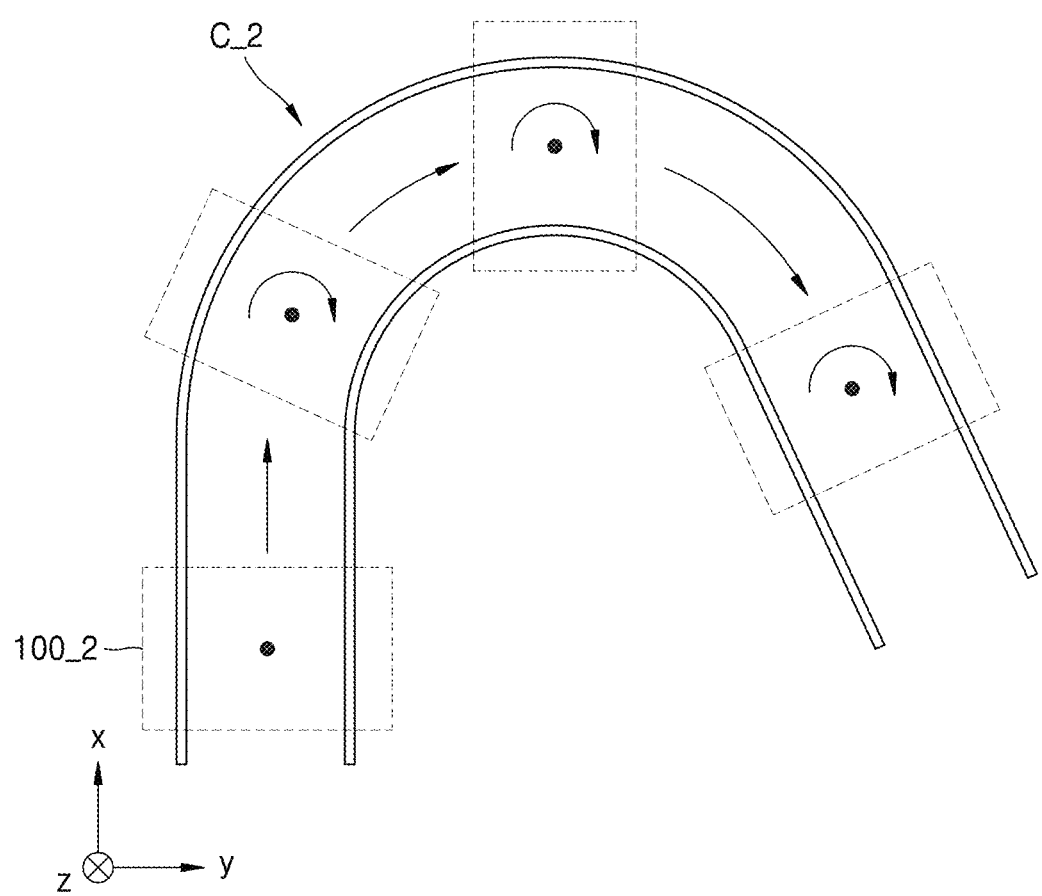
FIG. 5 is a conceptual diagram of a travel path of an article transport vehicle in a curved section of the overhead hoist transport device of FIG. 1.

FIG. 4 is a graph of a change in angular velocity of yaw over time of an article transport vehicle of an overhead hoist transport device according to an embodiment of the disclosure. FIG. 5 is a conceptual diagram of a travel path of an article transport vehicle in a curved section of an overhead hoist transport device of FIG. 1.

Figure 6:
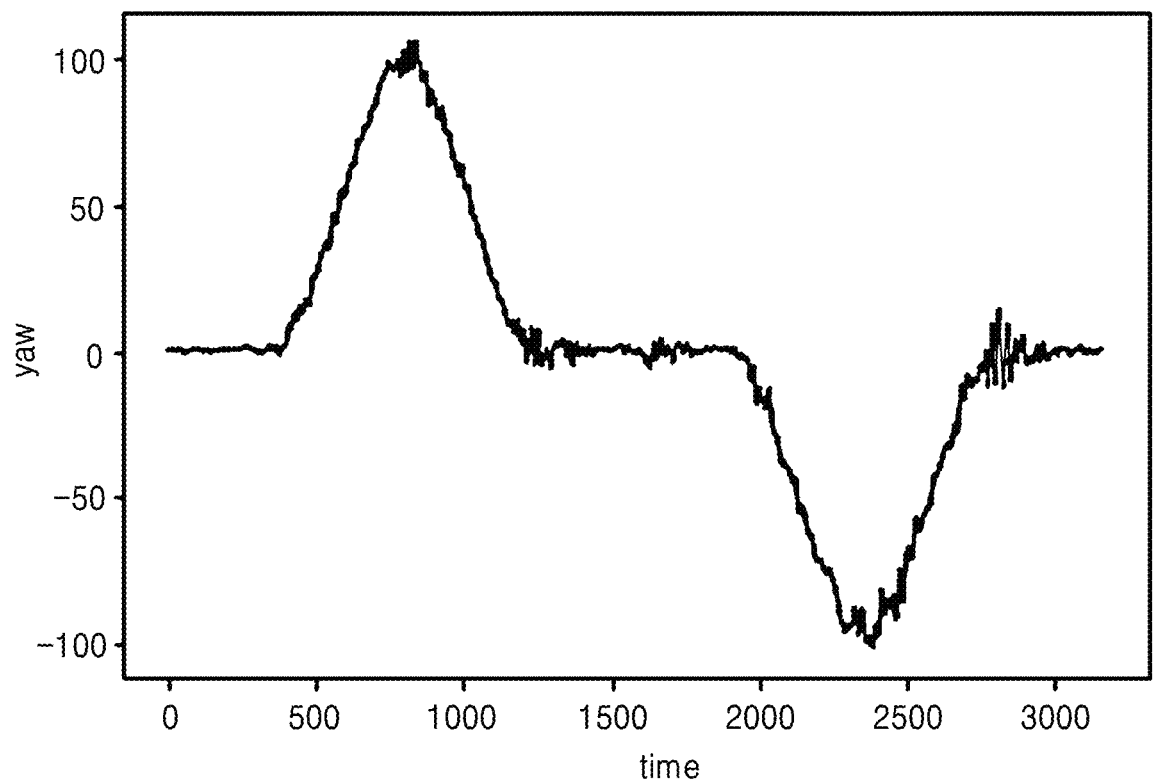
FIG. 6 is a graph of a change in angular velocity of yaw over time of an article transport vehicle of an overhead hoist transport device according to an embodiment of the disclosure.
Figure 7:
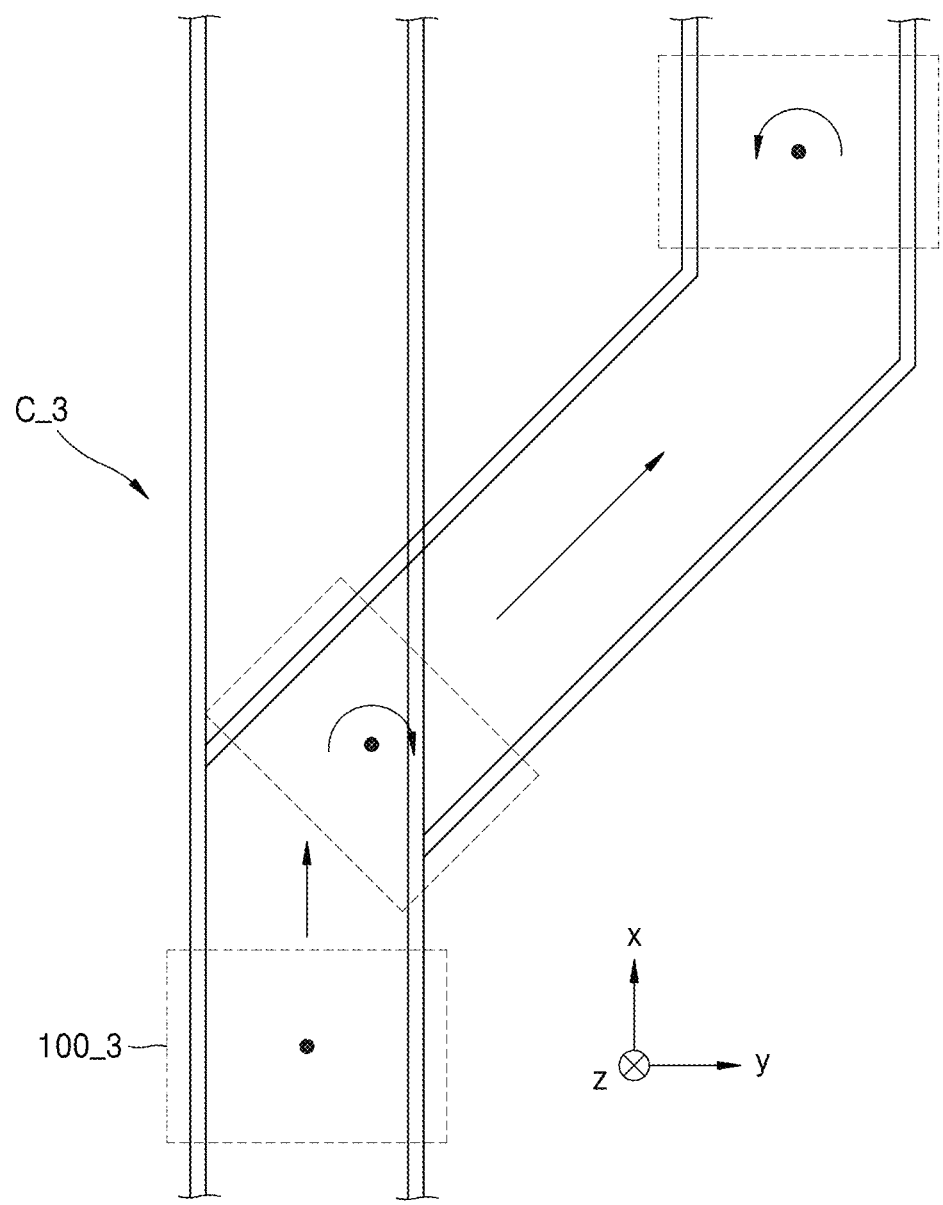
FIG. 7 is a conceptual diagram of a travel path of an article transport vehicle in a branching section of the overhead hoist transport device of FIG. 1.

FIG. 6 is a graph of a change in angular velocity of yaw over time of an article transport vehicle of an overhead hoist transport device according to an embodiment of the disclosure. FIG. 7 is a conceptual diagram of a travel path of an article transport vehicle in a branching section of an overhead hoist transport device of FIG. 1.

Hereinafter, with reference to FIGS. 4 to 7, a process by which the system determines in which section of the traveling rail the article transport vehicle is traveling based on the measured values of the measuring sensor will be described.

FIG. 4 is a graph in which the X-axis represents the time to pass the curved section and the Y-axis represents the angular velocity of yaw. In FIG. 4, the time and the angular velocity of yaw have arbitrary units.

FIG. 6 is a graph in which the X-axis represents the time to pass the branching section and the Y-axis represents the angular velocity of yaw. In FIG. 6, the time and the angular velocity of yaw have arbitrary units.

Referring to FIGS. 4 and 5, in the curved section C_2, a second article transport vehicle 100_2 may rotate clockwise or counterclockwise with respect to the Z axis. In other words, a graph of a change in angular velocity of yaw of the second article transport vehicle 100_2 over time may have one peak value.

In embodiments, the measuring sensor may measure the angular velocity of yaw of the second article transport vehicle 100_2 over time to obtain the number of peaks thereof. That is, when the number of peaks obtained by measuring the angular velocity of yaw thereof by the measuring sensor is one, the article transport vehicle (100 in FIG. 1) may be traveling in the curved section.

Referring to FIGS. 6 and 7, in the branching section C_3, a third article transport vehicle 100_3 may rotate clockwise or counterclockwise with intervals with respect to the Z axis.

In other words, the third article transport vehicle 100_3 may rotate clockwise or counterclockwise with intervals with respect to the Z axis throughout the branching section C_3.

That is, a graph of a change in angular velocity of yaw of the third article transport vehicle 100_3 may have at least two peak values. In embodiments, the measuring sensor may measure the angular velocity of yaw of the third article transport vehicle 100_3 over time to obtain the number of peaks thereof. That is, the article transport vehicle (100 in FIG. 1) may be traveling in the branching section when the number of peaks obtained by measuring the angular velocity of yaw thereof by the measuring sensor is two or more.

Referring to FIGS. 1 to 7, the system 600 of the overhead hoist transport device 10 may determine in which section of the traveling rail 200 the article transport vehicle 100 is traveling among the straight section C_1, the curved section C_2, and the branching section C_3. Specifically, the system 600 may determine, based on the angular velocity of yaw measured by the measuring sensor 500, in which section of the traveling rail 200 the article transport vehicle 100 is traveling among the straight section C_1, the curved section C_2, and the branching section C_3.

In embodiments, the system may determine, based on a direction in which the article transport vehicle 100 rotates with respect to the Z-axis, in which section the article transport vehicle 100 is traveling among the straight section C_1, the curved section C_2, and the branching section C_3. That is, when the article transport vehicle 100 does not rotate for a preset time, the system 600 may determine that the article transport vehicle 100 is traveling in the straight section C_1. When the article transport vehicle 100 rotates clockwise or counterclockwise only for a preset time, the system 600 may determine that the article transport vehicle 100 is traveling in the curved section C_2. When the article transport vehicle 100 rotates clockwise or counterclockwise for a preset time with intervals, the system 600 may determine that the article transport vehicle 100 is traveling in the branching section C_3.

In embodiments, when the number of peaks of yaw for a preset time measured by the measuring sensor 500 is zero, the system 600 may determine that the article transport vehicle 100 is traveling in the straight section C_1. When the number of peaks of yaw for a preset time measured by the measuring sensor 500 is one, the system 600 may determine that the article transport vehicle 100 is traveling in the curved section C_2. When the number of peaks of yaw for a preset time measured by the measuring sensor 500 is two or more, the system 600 may determine that the article transport vehicle 100 is traveling in the branching section C_3.

The overhead hoist transport device 10 of the disclosure may determine whether the wheels of the traveling transport vehicle 100 are detached through the system 600. That is, it is possible to determine whether wheels of the article transport vehicle are detached without a regular inspection by a worker, and respond thereto. In addition, although there was an error in conventional determination of whether wheels are detached through visual inspection, the overhead hoist transport device of the disclosure may determine whether wheels are detached through the system, which enables accurate determination of whether wheels are detached.

Figure 8:
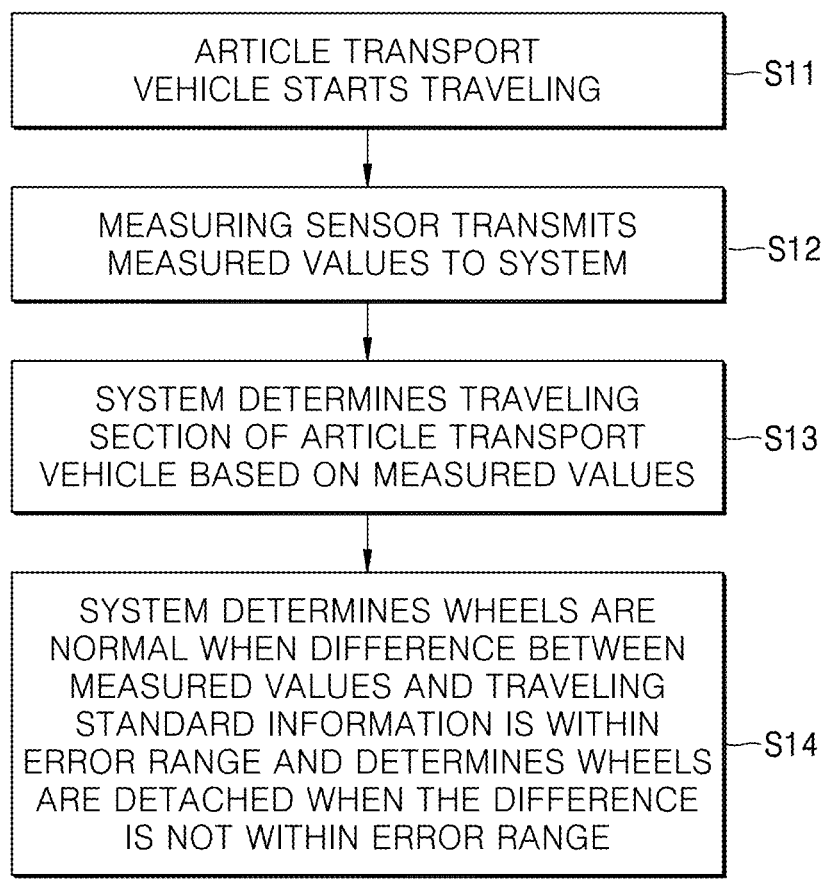
FIG. 8 is a schematic flowchart of a sequence in which a system of an overhead hoist transport device according to an embodiment of the disclosure determines whether wheels are detached.

FIG. 8 is a schematic flowchart of a sequence of determining whether wheels are detached from a system of an overhead hoist transport device according to an embodiment of the disclosure.

Hereinafter, with reference to FIG. 8, a process by which the system determines whether wheels of an article transport vehicle are detached based on measured values of a measuring sensor will be described.

Referring to FIGS. 1 to 8, in a process (S10) of determining whether wheels of the overhead hoist transport device are detached, firstly the article transport vehicle 100 starts traveling on the traveling rail 200 (S11). While the article transport vehicle 100 is traveling, the measuring sensor 500 may determine the traveling state of the article transport vehicle 100. In an embodiment, the measuring sensor 500 may measure the vibration, speed, and torque of the article transport vehicle 100.

The measured values of the measuring sensor 500 are transmitted to the system 600 (S12). The system 600 may determine, based on the measured values, in which section of the traveling rail 200 the article transport vehicle 100 is traveling among the straight section C_1, the curved section C_2, and the branching section C_3 (S13). In embodiments, the system 600 may determine, based on the angular velocity of yaw measured by the measuring sensor 500, in which the section of the traveling rail 200 the article transport vehicle 100 is traveling.

The system may store the measured values, as traveling standard value, obtained by traveling the article transport vehicle 100 in which the traveling wheels 111, the guide wheels 112, and the steering wheels 113 are in normal contact with the traveling rail 200. In other words, after the measured values are measured by traveling the article transport vehicle 100 in which all the wheels 111, 112, and 113 are in a normal state, the system 600 may store the traveling standards value of at least one of the straight section C_1, the curved section C_2, and the branching section C_3.

The system 600 compares the stored traveling standard value with the measured values to calculate the difference therebetween. When the difference between the traveling standard value and the measured values is within an error range, the system 600 determines that specific wheels of the article transport vehicle 100 are in a normal state, and when the difference between the traveling standard value and the measured values is not within the error range, the system 600 determines that specific wheels of the article transport vehicle 100 are in a detached state (S14).

In embodiments, the system 600 may determine, based on the measured values, in which section of the traveling rail 200 the article transport vehicle 100 is traveling among the straight section C_1, the curved section C_2, and the branching section C_3. When the difference between the traveling standard value and the measured values is not within the error range in the straight section C_1, the system 600 may determine that traveling wheels 111 are in a detached state. When the difference between the traveling standard value and the measured values is not within the error range in the curved section C_2, the system 600 may determine that guide wheels 112 are in a detached state. When the difference between the traveling standard value and the measured values is not within the error range in the branching section C_3, the system 600 may determine that steering wheels 113 are in a detached state.

Specifically, the system 600 may determine, based on the measured values, in which section of the traveling rail 200 the article transport vehicle 100 is traveling. Wheels that affect the measured values may vary depending on the type of wheels combined according to the section of the traveling rail 200. Therefore, the measured values may be used to determine whether specific wheels are detached for each section. In embodiments, the guide wheels 112 and the traveling wheels 111 may rotate in the curved section C_2, and the measured values measured in the curved section C_2 may be used to determine whether guide wheels 112 are detached.

Specifically, the system 600 may determine that the article transport vehicle 100 is traveling in the straight section C_1 based on the measured values, and may determine whether the traveling wheels 111 are detached by comparing the measured values with the traveling standard value of the straight section C_1. The system 600 may determine that the article transport vehicle 100 is traveling in the curved section C_2 based on the measured values, and may determine whether the guide wheels 112 are detached by comparing the measured values with the traveling standard value of the curved section C_2. The system 600 may determine that the article transport vehicle 100 is traveling in the branching section C_3 based on the measured values, and may determine whether the steering wheels 113 are detached by comparing the measured values with the traveling standard value of the branching section C_3.

In embodiments, based on the measured values of a first transport vehicle 100_1 traveling in the straight section C_1, the system 600 may determine whether the traveling wheels 111 of the first transport vehicle 100_1 are detached. Based on the measured values of a second article transport vehicle 100_2 traveling in the curved section C_2, the system 600 may determine whether the guide wheels 112 of the second article transport vehicle 100_2 are detached. Based on the measured values of a third article transport vehicle 100_3 traveling in the branching section C_3, the system 600 may determine whether the steering wheels 113 of the third article transport vehicle 100_3 are detached.

Figure 9:
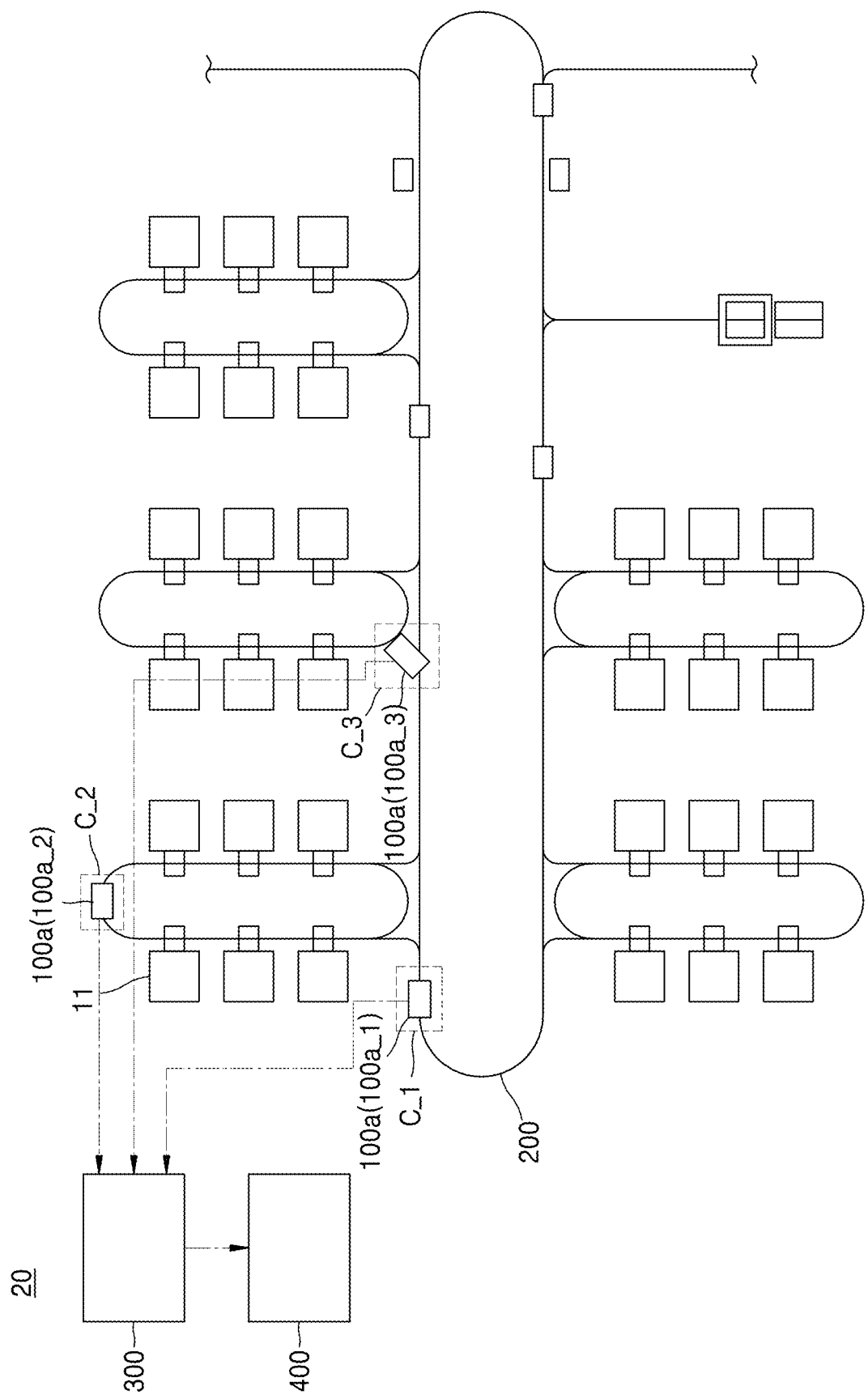
FIG. 9 is a schematic conceptual diagram of an overhead hoist transport device according to an embodiment of the disclosure.
Figure 10:
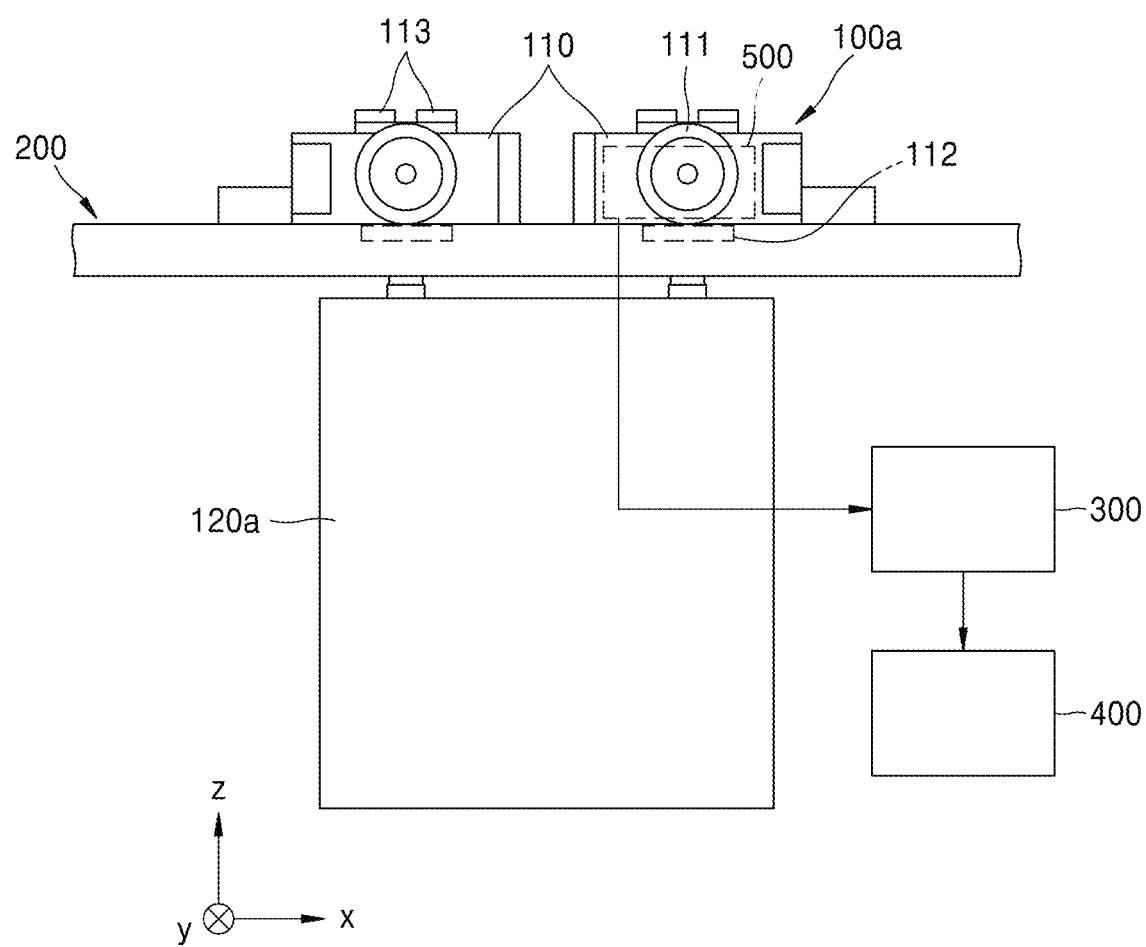
FIGS. 10 and 11 are detailed configuration diagrams of the overhead hoist transport device of FIG. 9.
Figure 11:
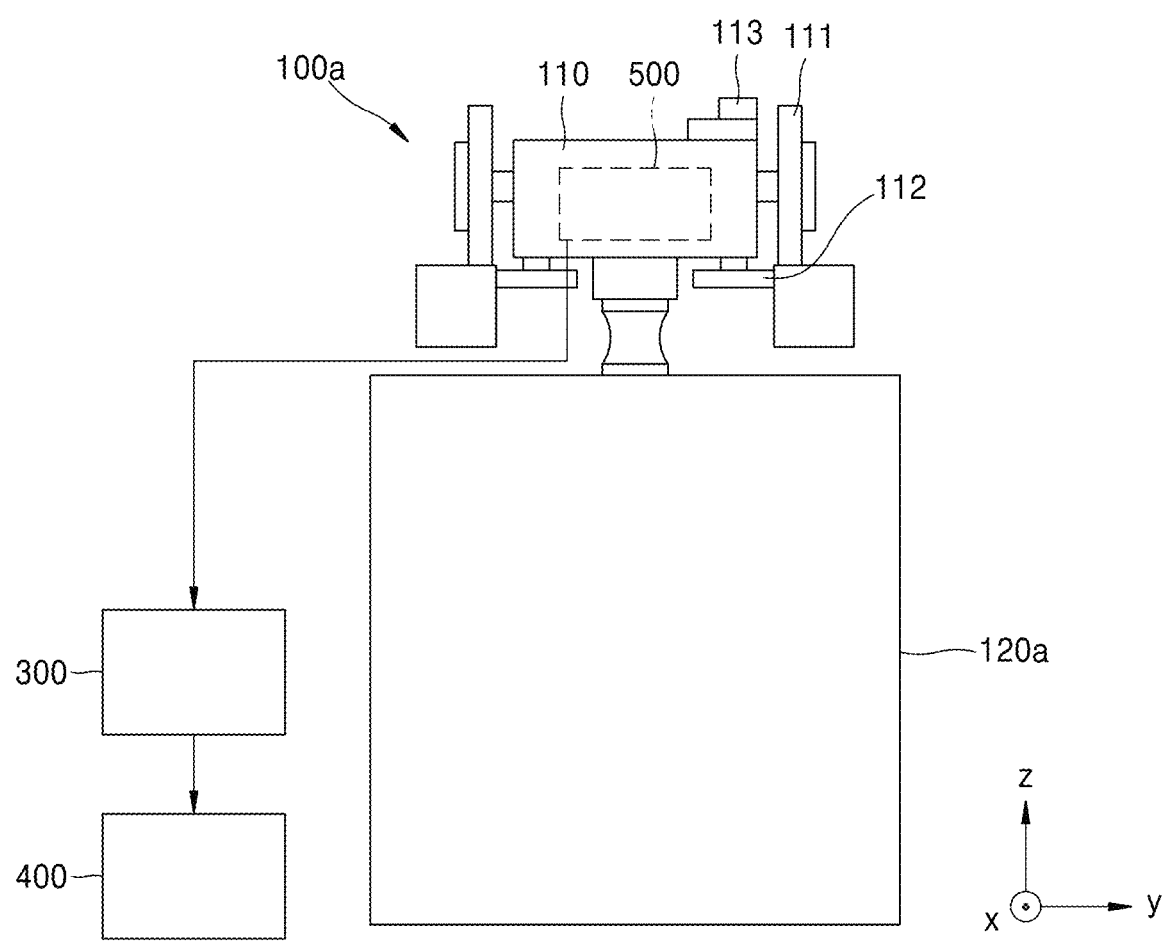
Figure 12:
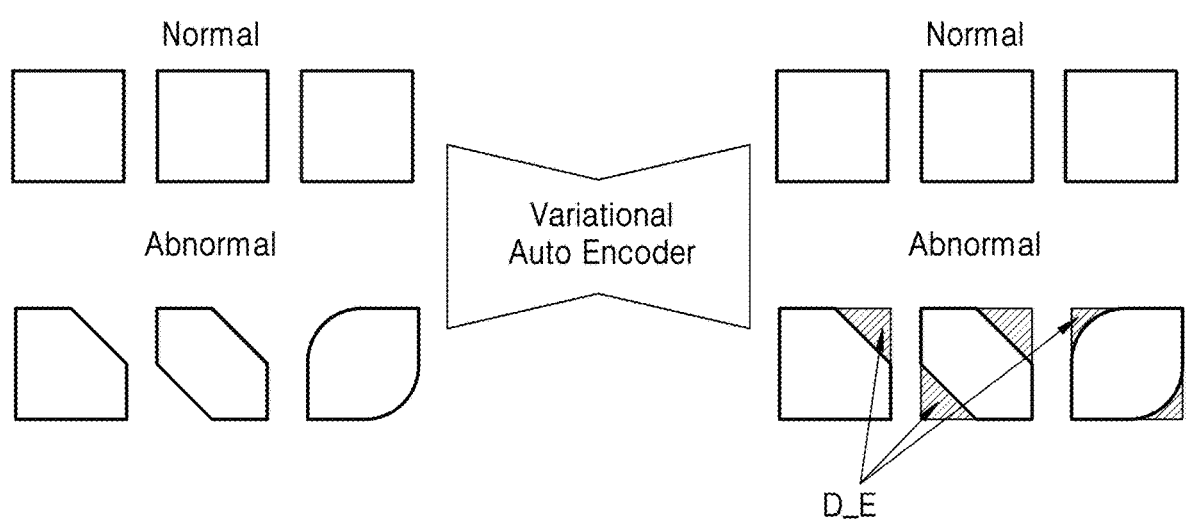
FIG. 12 is a schematic conceptual diagram of how a system of the overhead hoist transport device of FIG. 9 determines whether wheels are detached.
Figure 13:
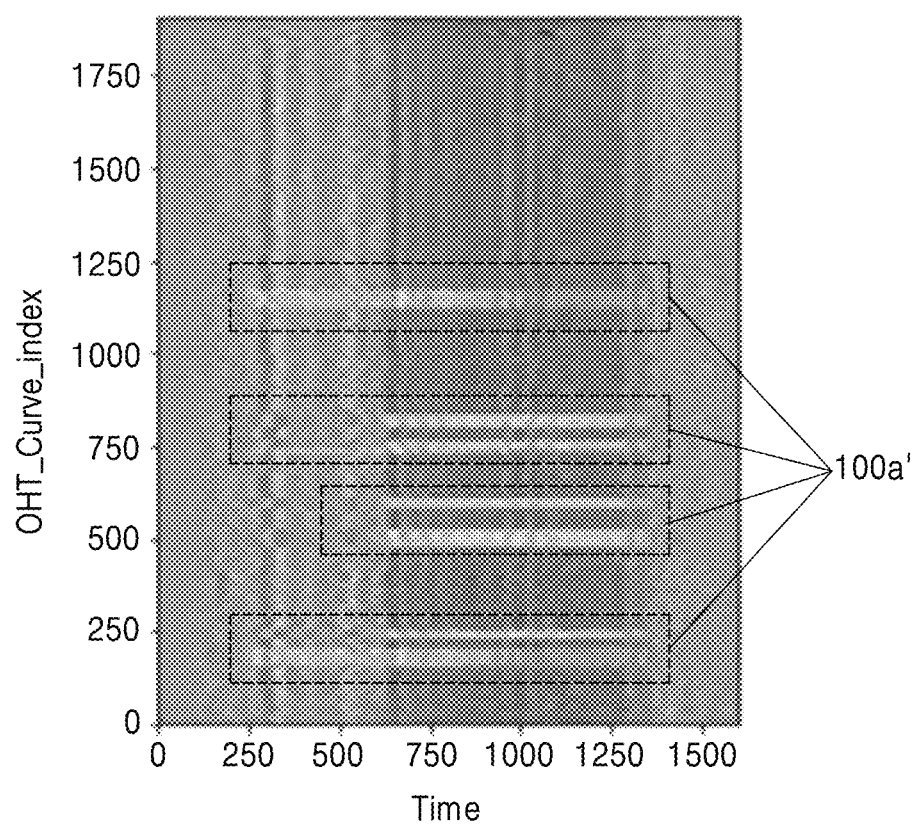
FIG. 13 is a graph of visualized residual data of the overhead hoist transport device of FIG. 9.

FIG. 9 is a schematic conceptual diagram of an overhead hoist transport device according to an embodiment of the disclosure. FIGS. 10 and 11 are detailed configuration diagrams of an overhead hoist transport device of FIG. 9. FIG. 12 is a schematic conceptual diagram of a method for determining whether wheels are detached through a system of an overhead hoist transport device of FIG. 9. FIG. 13 is a graph of visualized residual data of an overhead hoist transport device of FIG. 9.

Hereinafter, overlapping contents of an overhead hoist transport device 20 of FIG. 9 and an overhead hoist transport device (10 in FIG. 1) of FIG. 1 will be omitted, and differences will be described.

Referring to FIGS. 9 to 13, the overhead hoist transport device 20 may include transport vehicles 100a, a traveling rail 200, measuring sensors 500, a server 300, and a system 400.

In embodiments, the article transport vehicles 100a may include an article transport vehicle (100 in FIG. 1) of FIG. 1. In embodiments, the traveling rail 200 may include a traveling rail (200 in FIG. 1) of FIG. 1.

The measuring sensors 500 of the overhead hoist transport device 20 may be attached to the different article transport vehicles 100a. The measuring sensors 500 may measure the traveling state of the different article transport vehicles 100a in real time. Specifically, the measuring sensors 500 may measure the speed, vibration, and the torque of the different article transport vehicles 100a. That is, the measuring sensors 500 may measure the vibration of the article transport vehicles attached thereto in X-axis, Y-axis, yaw, pitch and roll directions, and may measure the speed and torque of the article transport vehicles attached thereto in front wheel, rear wheel, hoist, and slide directions. In embodiments, the measuring sensors 500 may include a 6-axis gyro sensor. In embodiments, the measuring sensors 500 may include a measuring sensor (121 in FIG. 1) of FIG. 1.

The server 300 of the overhead hoist transport device 20 may receive and transmit measured values of the measuring sensors 500. The server 300 may receive the measured values from the measuring sensors 500 and transmit the measured values to the system 400. The server 300 may be positioned apart from the article transport vehicles 100a. In embodiments, the measured values measured by the measuring sensors 500 may be transmitted to the system 400 via a server. That is, the overhead hoist transport device 20 may have an internet of things (IOT) environment via the server 300. The measuring sensors 500 and the system 400 may transmit and receive value wirelessly to and from the server 300. That is, the overhead hoist transport device 20 may determine in real time whether wheels of the article transport vehicles 100a are detached.

The system 400 of the overhead hoist transport device 20 may transmit and receive measured values to and from the server 300. In embodiments, the system 400 may be positioned apart from the article transport vehicles 100a.

The system 400 may determine whether specific wheels of the article transport vehicles 100a are detached in sections of the traveling rail 200. Specifically, the system 400 may determine whether specific wheels of the article transport vehicles are detached in at least one traveling section among the straight section C_1, the curved section C_2, and the branching section C_3. In embodiments, the system 400 may determine whether the traveling wheels 111 of the article transport vehicle traveling in the straight section C_1 are detached. The system 400 may determine whether the guide wheels 112 of the article transport vehicle traveling in the curved section C_2 are detached. The system 400 may determine whether the steering wheels 113 of the article transport vehicle traveling in the branching section C_3 are detached.

The system 400 may receive measured values wirelessly via the server 300. Accordingly, the system 400 may monitor the traveling state of the article transport vehicles 100a in real time. In embodiments, one system may monitor the speed, vibration, and torque of the article transport vehicles 100a.

The system 400 may determine a traveling section of the article transport vehicles 100a based on the measured values. In other words, the system 400 may determine, based on the measured values of the article transport vehicles 100a, in which section each of the article transport vehicles 100 is traveling among the straight section C_1, the curved section C_2, and the branching section C_3.

In embodiments, the system 400 may determine, based on the angular velocity of yaw among the measured values, in which section each of the article transport vehicles 100a is traveling among the straight section C_1, the curved section C_2, and the branching section C_3. In embodiments, based on a change in angular velocity of yaw among the measured values, the system 400 may determine in which section each of the article transport vehicles 100a is traveling. In embodiments, based on a direction in which each of the article transport vehicles 100a rotates with respect to the Z-axis among the measured values, the system 400 may determine in which section each of the article transport vehicles 100a is traveling. In embodiments, the method of determining, by the system 400, in which section each of the article transport vehicles 100a is traveling may include a method of determining, by the system (122 of FIG. 2) described in FIG. 8, in which section the article transport vehicle (100 of FIG. 2) is traveling.

The system 400 may determine, based on measured values, in which section of the traveling rail 200 each of the article transport vehicles 100a is traveling and determine whether wheels are detached. In embodiments, the method of determining, by the system 400, whether specific wheels of the article transport vehicles 100a are detached for each traveling section may include a method of determining, by the system (122 in FIG. 2), whether specific wheels of the article transport vehicle (100 in FIG. 2) are detached for each traveling section.

In embodiments, the system 400 may generate travel reference values of the straight section C_1, the curved section C_2, and the branching section C_3. In embodiments, the system 400 may generate travel reference values of the straight section C_1, the curved section C_2, and the branching section C_3 through machine learning. In other words, the system 400 may generate travel reference values for determining whether wheels are detached based on the measured values and the results of whether wheels are detached.

In embodiments, the system 400 may generate residual data (D_E) by calculating the travel reference values and measured values. The residual data (D_E) may be the difference between the travel reference values and the measured values. When the residual data (D_E) is within an error range, the system 400 may determine that specific wheels are in a normal state depending on the traveling section. When the residual data (D_E) is not within the error range, the system 400 may determine that specific wheels are in a detached state depending on the traveling section.

Specifically, when the residual data (D_E) of the measured values of the first article transport vehicle 100a_1 traveling in the straight section C_1 is not within the error range, the system 400 may determine that the traveling wheels 111 of the first article transport vehicle 100a_1 are detached. When the residual data (D_E) of the measured values of the second article transport vehicle 100a_2 traveling in the curved section C_2 is not within the error range, the system 400 may determine that the guide wheels 112 of the second article transport vehicle 100a_2 are detached. When the residual data (D_E) of the measured values of the third article transport vehicle 100a_3 traveling in the branching section C_3 is not within the error range, the system 400 may determine that the steering wheels 113 of the third article transport vehicle 100a_3 are detached.

In embodiments, the system 400 may determine whether specific wheels of the article transport vehicles 100a are detached by visualizing the residual data (D_E). FIG. 13, which is an embodiment, is a graph of visualized residual data (D_E) in which each section number of the article transport vehicles is represented by the Y-axis and section passage time is represented by the X-axis. Among the article transport vehicles, an abnormal article transport vehicle having larger residual data than other article transport vehicles may appear on a graph in a different color from other transport vehicles. In other words, the system may determine that specific wheels of an article transport vehicle 100a' having an abnormal measured value are detached. In embodiments, the system may determine that the guide wheels 112 are detached when the article transport vehicle 100a' having an abnormal measured value is traveling in the curved section C_2.

In embodiments, the system 400 may include a variational autoencoder (VAE). In embodiments, the system 400 may determine whether specific wheels of the article transport vehicles 100a are detached through VAE. In other words, the system 400 may use the residual data (D_E) to learn the travel reference values. Specifically, the system 400 may learn the travel reference values based on measured values with the residual data (D_E) within the error range. Thereafter, the system 400 may determine whether specific wheels of the article transport vehicles 100a are detached based on the learned travel reference values.

Figure 14:
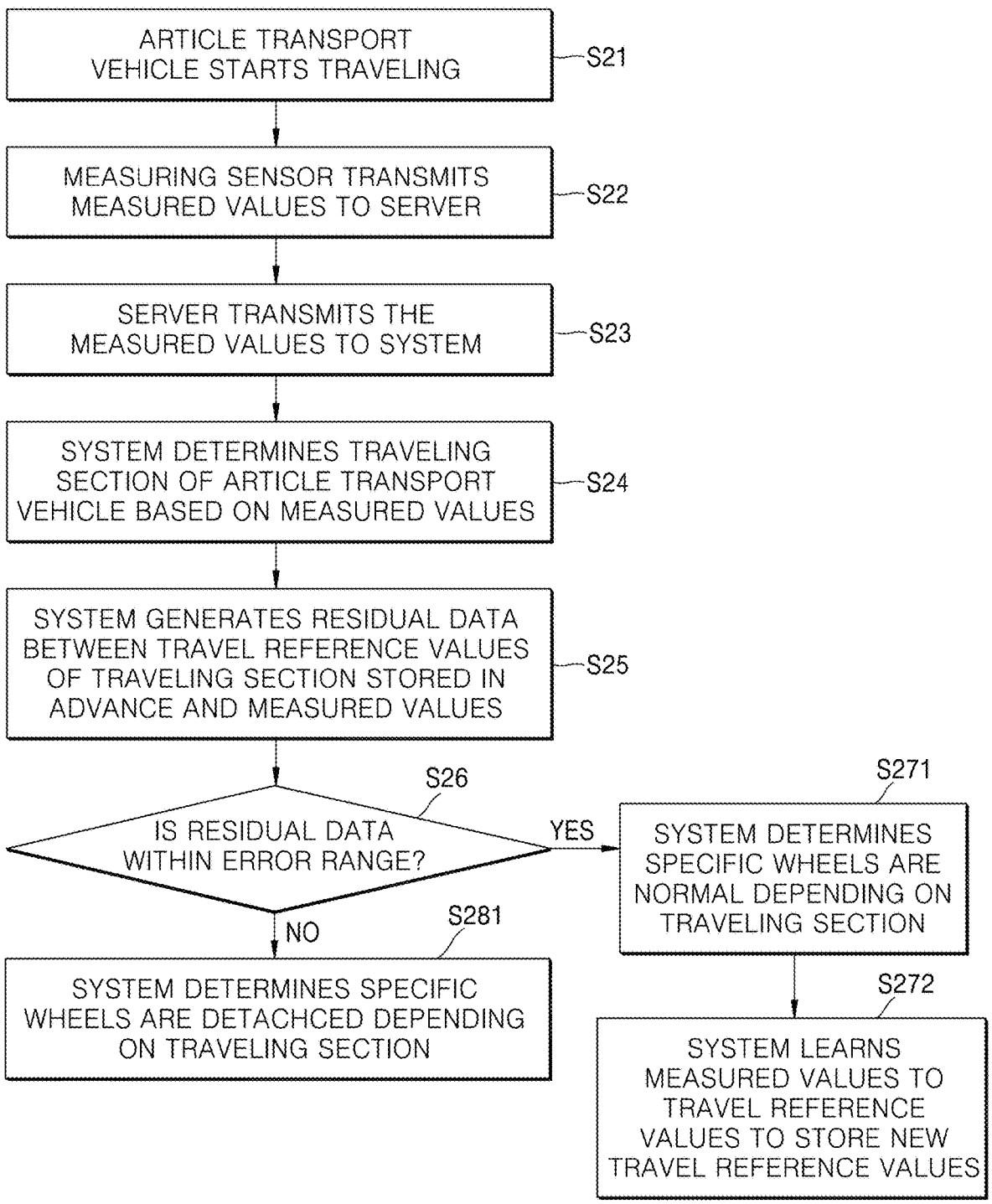
FIG. 14 is a schematic flowchart of a sequence in which a system of an overhead hoist transport device according to an embodiment of the disclosure determines whether wheels are detached.

FIG. 14 is a schematic flowchart of a sequence in which a system of an overhead hoist transport device according to an embodiment of the disclosure determines whether wheels are detached.

Referring to FIGS. 9 to 14, in a process (S20) of determining whether wheels of the overhead hoist transport device are detached, firstly the article transport vehicles start traveling in the traveling rail (S21). While the article transport vehicles are traveling, the measuring sensors 500 may measure the traveling state of the article transport vehicles. In an embodiment, the measuring sensors 500 may measure the vibration, speed, and torque of the article transport vehicles.

The measured values of the measuring sensors 500 are transmitted to the server 300 (S22). The server 300 transmits the measured values to the system 400. In embodiments, the measured values from the measuring sensors 500 are transmitted wirelessly to the server 300.

The system 400 determines, based on the measured values, in which section of the traveling rail 200 the article transport vehicles are traveling among the straight section C_1, the curved section C_2, and the branching section C_3 (S24). In embodiments, the system 400 may determine, based on the angular velocity of yaw measured by the measuring sensors 500, in which the section of the traveling rail 200 the article transport vehicles are traveling.

The system 400 may store travel reference values of the straight section C_1, the curved section C_2, and the branching section C_3. In embodiments, the system 400 may generate at least one of the travel reference values of the straight section C_1, the curved section C_2, and the branching section C_3 through machine learning. In other words, the system 400 may generate travel reference values for determining whether wheels are detached based on the measured values and the results of whether wheels are detached.

The system 40 generates residual data (D_E) by calculating the travel reference values and the measured values (S25). The residual data (D_E) may be the difference between the travel reference values and the measured values. The system 400 determines whether the residual data is within the error range (S26).

When the residual data (D_E) is within the error range, the system 400 determines that specific wheels are in a normal state depending on the traveling section (S271). After having determined that specific wheels are in a normal state, the system learns the measured values of wheels that are determined to be normal to the travel reference values and stores the new travel reference values (S272).

When the residual data (D_E) is not within the error range, the system 400 determines that specific wheels are in a detached state which is abnormal depending on the traveling section (S281).

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. An overhead hoist transport device comprising:
an article transport vehicle having a space in which articles are loaded and unloaded, and including traveling wheels, guide wheels, and steering wheels;
a traveling rail positioned along a ceiling of a semiconductor manufacturing line and providing a moving path for the article transport vehicle;
a measuring sensor attached to the article transport vehicle and configured to measure a traveling state of the article transport vehicle; and
a system configured to receive measured values from the measuring sensor;
wherein
the traveling rail includes at least one traveling section among a straight section, a curved section, and a branching section, and wherein
the system is further configured to determine whether specific wheels of the article transport vehicle are detached in the traveling section.

2. The overhead hoist transport device of claim 1, wherein the measuring sensor is further configured to measure a speed, vibration, and a torque of the article transport vehicle.

3. The overhead hoist transport device of claim 2, wherein the measuring sensor includes a 6-axis gyro sensor.

4. The overhead hoist transport device of claim 1, wherein an axis perpendicular to the ceiling is a Z-axis, and wherein the curved section is a section in which the article transport vehicle rotates clockwise or counterclockwise with respect to the Z-axis, and the branching section is a section in which the article transport vehicle rotates at intervals clockwise and counterclockwise with respect to the Z-axis.

5. The overhead hoist transport device of claim 1, wherein the system is further configured to determine in which traveling section of the traveling rail the article transport vehicle is traveling.

6. The overhead hoist transport device of claim 1, wherein an axis perpendicular to the ceiling is a Z-axis, wherein the measuring sensor is further configured to measure a direction in which the article transport vehicle rotates with respect to the Z-axis, and wherein the system is further configured to determine in which section of the traveling rail the article transport vehicle is traveling with respect to the direction.

7. The overhead hoist transport device of claim 1, wherein the traveling wheels, the guide wheels, and the steering wheels of the article transport vehicle rotate are different in each of the straight section, the curved section, and the branching section.

8. The overhead hoist transport device of claim 1,
wherein the system is further configured to:
when the article transport vehicle is traveling in the straight section, determine whether the traveling wheels are detached;
when the article transport vehicle is traveling in the curved section, determine whether the guide wheels are detached; and
when the article transport vehicle is traveling in the branching section, determine whether the steering wheels are detached.

9. The overhead hoist transport device of claim 1,
wherein the system is further configured to store traveling standard value about the traveling section,
and compare the traveling standard value with the measured values of the measuring sensor to determine whether wheels of the article transport vehicle are detached.

10. An overhead hoist transport device comprising:
transport vehicles having a space in which articles are loaded and unloaded, and including traveling wheels, guide wheels, and steering wheels;
a traveling rail positioned along the ceiling of a semiconductor manufacturing line and providing a moving path for the article transport vehicles;
measuring sensors attached to the article transport vehicles and configured to measure a traveling state of different article transport vehicles in real time;
a server for transmitting and receiving measured values of the measuring sensors; and
a system configured to receive the measured values from the server;
wherein
the traveling rail includes at least one traveling section among a straight section, a curved section, and a branching section, and wherein
the system is further configured to determine whether specific wheels of the article transport vehicles are detached in the traveling section.

11. The overhead hoist transport device of claim 10,
wherein the server and the system are located apart from the article transport vehicles,
and wherein the measuring sensors are further configured to transmit and receive measured values wirelessly to and from the server.

12. The overhead hoist transport device of claim 10,
wherein the system is further configured to monitor the traveling state of the article transport vehicles in real time.

13. The overhead hoist transport device of claim 10,
wherein the system is further configured to generate travel reference values and
generate residual data by calculating the travel reference values and the measured values.

14. The overhead hoist transport device of claim 13,
wherein the system is further configured to determine whether specific wheels of the article transport vehicles are detached by visualizing the residual data.

15. The overhead hoist transport device of claim 10,
wherein the system includes a variational autoencoder
and is further configured to determine, through the variant autoencoder, whether specific wheels of the article transport vehicles are detached.

16. The overhead hoist transport device of claim 10,
wherein an axis perpendicular to the ceiling is a Z-axis,
wherein the measuring sensors are further configured to measure an angle by which the article transport vehicles rotate with respect to the Z-axis,
and wherein the system is further configured to determine in real time in which section of the traveling rail the article transport vehicles are traveling based on the number of peaks during the section passage time.

17. The overhead hoist transport device of claim 16,
wherein the system is further configured to:
determine whether the traveling wheels of article transport vehicle traveling in the straight section among the article transport vehicles are detached;
determine whether the guide wheels of article transport vehicle traveling in the curved section among the article transport vehicles are detached; and
determine whether the steering wheels of article transport vehicle traveling in the branching section among the article transport vehicles are detached.

18. The overhead hoist transport device of claim 10,
wherein the traveling wheels are configured to be connected to and driven by a drive,
and the guide wheels and the steering wheels are configured to rotate in contact with the traveling rail.

19. The overhead hoist transport device of claim 10,
wherein the measuring sensors include a 6-axis gyro sensor that measures vibration, a speed, and a torque of different article transport vehicles.

20. An overhead hoist transport device comprising:
article transport vehicles having a space in which articles are loaded and unloaded and including traveling wheels, guide wheels, and steering wheels;
a traveling rail positioned along a ceiling of a semiconductor manufacturing line, providing a moving path for the article transport vehicles, and including a straight section, a curved section, and a branching section;
measuring sensors attached to the different article transport vehicles and configured to measure a speed, vibration, and a torque of the article transport vehicles in real time;
a server for transmitting and receiving measured values of the measuring sensors; and
a system configured to receive the measured values from the server and monitor the traveling state of the article transport vehicles;
wherein
the server and the system are located apart from the article transport vehicles,
and the system is further configured to determine whether specific wheels of the article transport vehicles are detached for each section of the traveling rail.

* * * * *